United States Patent
Yang et al.

(10) Patent No.: US 12,406,942 B2
(45) Date of Patent: Sep. 2, 2025

(54) SEMICONDUCTOR DEVICE

(71) Applicant: TAIWAN SEMICONDUCTOR MANUFACTURING CO., LTD., Hsinchu (TW)

(72) Inventors: Ming-Hui Yang, New Taipei (TW); Chun-Ting Liao, Hsinchu (TW); Yi-Te Chen, Hsinchu (TW); Chen-Yuan Chen, Hsinchu (TW); Ho-Chun Liou, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/191,304

(22) Filed: Mar. 28, 2023

(65) Prior Publication Data
US 2023/0238337 A1 Jul. 27, 2023

Related U.S. Application Data

(63) Continuation of application No. 17/320,079, filed on May 13, 2021, now Pat. No. 11,791,285, which is a (Continued)

(51) Int. Cl.
*H01L 23/00* (2006.01)
*H01L 23/58* (2006.01)

(52) U.S. Cl.
CPC .......... *H01L 23/562* (2013.01); *H01L 23/564* (2013.01); *H01L 23/585* (2013.01);
(Continued)

(58) Field of Classification Search
None
See application file for complete search history.

(56) References Cited

U.S. PATENT DOCUMENTS

| 6,427,222 | B1 | 7/2002 | Shau |
| 7,893,459 | B2 | 2/2011 | Wang et al. |

(Continued)

FOREIGN PATENT DOCUMENTS

| CN | 103094221 A | 5/2013 |
| JP | 2004-297022 A | 10/2004 |

(Continued)

*Primary Examiner* — Bo B Jang
(74) *Attorney, Agent, or Firm* — Maschoff Brennan

(57) ABSTRACT

A device includes an integrated circuit, a first seal ring, a second seal ring, and a dielectric layer. The first seal ring surrounds the integrated circuit and includes a plurality of first seal portions separated from each other by a plurality of first gaps. The second seal ring surrounds the integrated circuit, between the integrated circuit and the first seal ring and includes a plurality of second seal portions separated from each other by a plurality of second gaps. The dielectric layer surrounds the first and second seal rings and includes a plurality of first filling portions in the first gaps, respectively, and a plurality of second filling portions in the second gaps, respectively. A connection line of one of the first filling portions and one of the second filling portions closest to said one of the first filling portions is not parallel to edges of the integrated circuit.

20 Claims, 8 Drawing Sheets

Related U.S. Application Data continuation of application No. 16/523,914, filed on Jul. 26, 2019, now Pat. No. 11,011,478, which is a continuation of application No. 14/795,788, filed on Jul. 9, 2015, now Pat. No. 10,366,956.

(60) Provisional application No. 62/173,822, filed on Jun. 10, 2015.

(52) U.S. Cl.
CPC .... *H01L 2924/14* (2013.01); *H01L 2924/141* (2013.01); *H01L 2924/1421* (2013.01); *H01L 2924/143* (2013.01)

(56) References Cited

U.S. PATENT DOCUMENTS

| | | | |
|---|---|---|---|
| 7,898,056 | B1 | 3/2011 | Keramat et al. |
| 8,803,290 | B2 | 8/2014 | Frederick, Jr. et al. |
| 2004/0150070 | A1 | 8/2004 | Okada et al. |
| 2006/0076651 | A1 | 4/2006 | Tsutsue |
| 2006/0102980 | A1 | 5/2006 | Nakashiba |
| 2007/0012976 | A1 | 1/2007 | Yaegashi et al. |
| 2008/0061397 | A1 | 3/2008 | Uchida |
| 2008/0251923 | A1 | 10/2008 | Wang et al. |
| 2009/0140391 | A1 | 6/2009 | Hou et al. |
| 2009/0294897 | A1 | 12/2009 | Lee et al. |
| 2010/0084751 | A1 | 4/2010 | Frederick, Jr. et al. |
| 2010/0102421 | A1 | 4/2010 | Chang et al. |
| 2012/0038028 | A1 | 2/2012 | Yaung et al. |
| 2013/0256826 | A1* | 10/2013 | Gambino ............ H01L 29/0619 257/496 |
| 2014/0035106 | A1 | 2/2014 | Vu et al. |
| 2014/0035107 | A1 | 2/2014 | Yang et al. |
| 2014/0312466 | A1 | 10/2014 | Frederick, Jr. et al. |
| 2016/0035639 | A1 | 2/2016 | Wu et al. |
| 2016/0358917 | A1 | 12/2016 | Mallikarjunaswany |

FOREIGN PATENT DOCUMENTS

| | | |
|---|---|---|
| JP | 2005-286264 A | 10/2005 |
| JP | 5090696 B2 | 12/2012 |
| KR | 20110082159 A | 7/2011 |
| TW | 543178 B | 7/2003 |
| TW | 201436005 A | 9/2014 |
| TW | 201519331 A | 5/2015 |

* cited by examiner

SEMICONDUCTOR DEVICE

PRIORITY CLAIM AND CROSS-REFERENCE

The present application is a continuation of U.S. patent application Ser. No. 17/320,079, filed May 13, 2021, which is a continuation of U.S. patent application Ser. No. 16/523,914, filed Jul. 26, 2019, now U.S. Pat. No. 11,011,478 issued on May 18, 2021, which is a continuation of U.S. patent application Ser. No. 14/795,788, filed Jul. 9, 2015, now U.S. Pat. No. 10,366,956 issued on Jul. 30, 2019, which claims priority from U.S. Provisional Application No. 62/173,822, filed on Jun. 10, 2015, which are incorporated herein by reference in their entirety.

BACKGROUND

In general, integrated circuits are fabricated simultaneously in multiples on a wafer. The wafer is sawed into individual chips once the fabrication is complete. The uppermost surfaces of the chips are generally protected by the deposition of a passivation layer. However, this passivation layer can not cover the periphery of each chip. Thus, the periphery of each chip is exposed to undesirable moisture and ionic contaminants. Accordingly, "seal rings," also known as "guard rings," generally are formed of at least one metal band around at least the upper periphery of each chip as part of the fabrication of the IC dice prior to sawing the wafer. These seal rings can provide structural reinforcement and stop undesirable moisture and mobile ionic contaminants from entering chip active circuitry regions and affecting operational reliability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
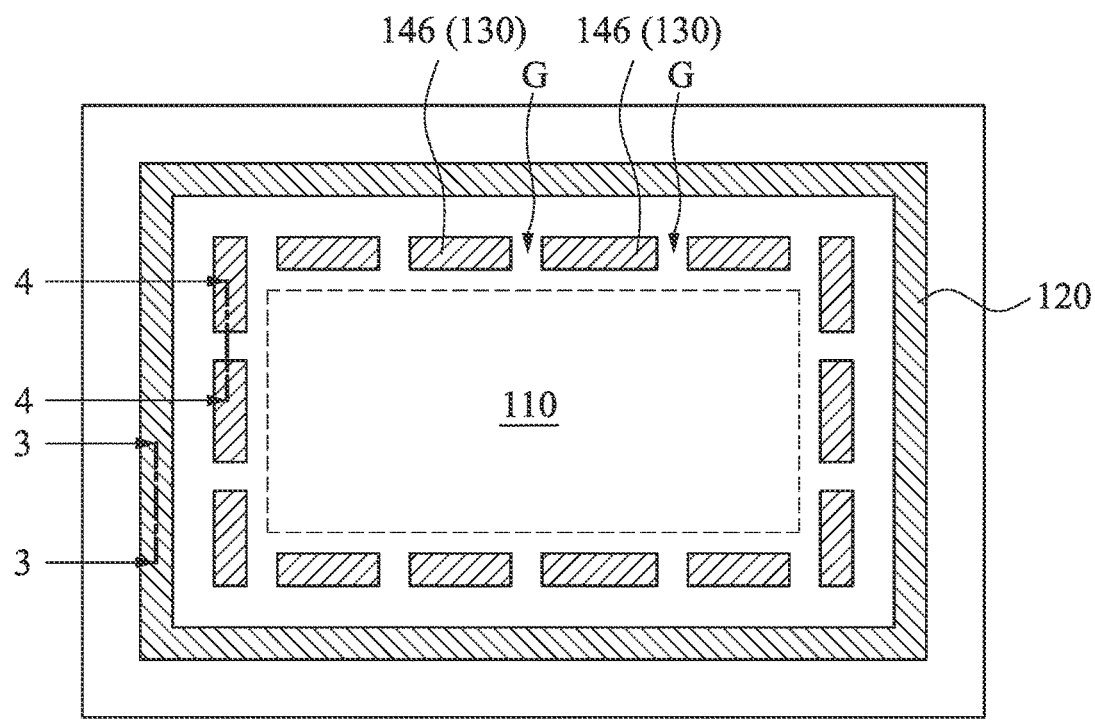
FIG. 1 is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
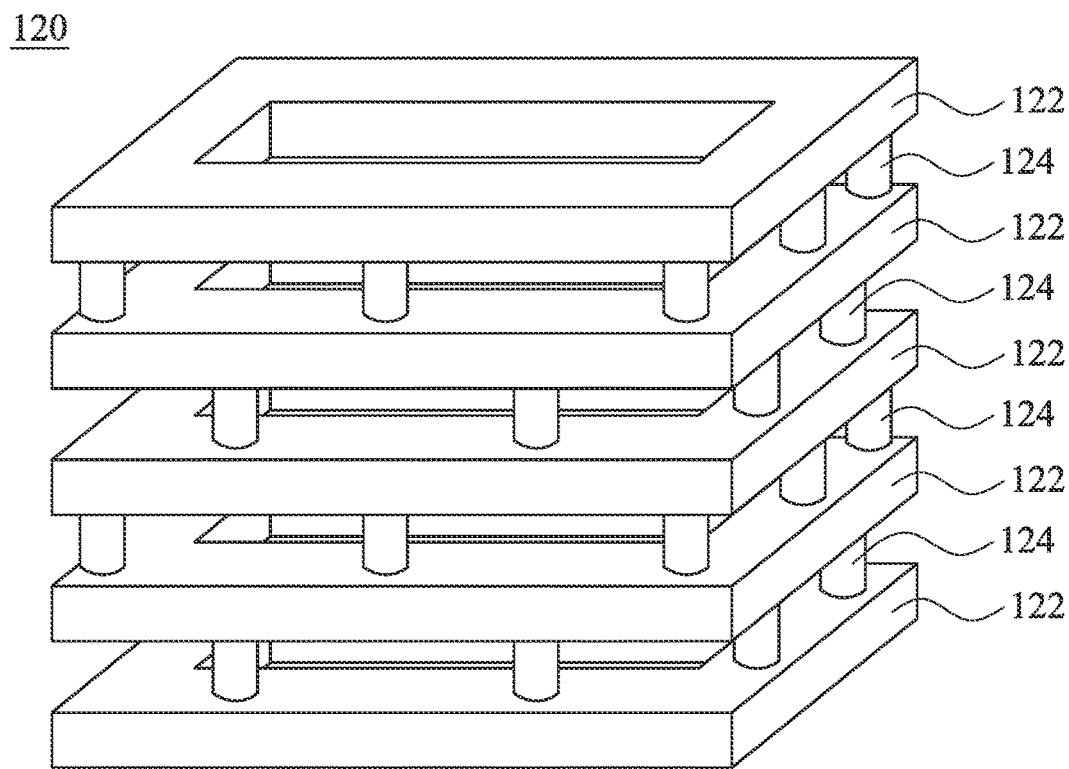
FIG. 2 is a schematic diagram of metal layers and contacts of an outer seal ring in FIG. 1 in accordance with some embodiments of the present disclosure.

A semiconductor device and a method of manufacturing the semiconductor device are provided in accordance with various exemplary embodiments. The variations of the embodiments are discussed. FIG. 1 is a top view of a semiconductor device in accordance with some embodiments of the present disclosure, and FIG. 2 is a schematic diagram of metal layers 122 and contacts 124 of an outer seal ring 120 in FIG. 1 in accordance with some embodiments of the present disclosure. The semiconductor device includes an integrated circuit 110, at least one outer seal ring 120, and at least one inner seal ring 130. The outer seal ring 120 surrounds the integrated circuit 110. The outer seal ring 120 includes a plurality of metal layers 122 in a stacked configuration, and the metal layers 122 are closed loops, as shown in FIG. 2. In other words, the metal layers 122 surround the integrated circuit 110 continuously. The inner seal ring 130 is disposed between the outer seal ring 120 and the integrated circuit 110 and separated from the outer seal ring 120. The inner seal ring 130 has at least one gap G extending from a region encircled by the inner seal ring 130 to a region outside the inner seal ring 130. In other words, the inner seal ring 130 surrounds the integrated circuit 110 discontinuously. It is noted that the number of metal layers 122 in FIG. 2 is illustrative, and should not limit the claimed scope of the present disclosure. A person having ordinary skill in the art may select a suitable number for the metal layers 122 according to actual situations.

The outer seal ring 120 can provide structural reinforcement and stop undesirable moisture and mobile ionic contaminants from entering the integrated circuit 110 and affecting operational reliability. In greater detail, in FIG. 1, the metal layers 122 of the outer seal ring 120 are closed loops, i.e., the metal layers 122 respectively surround the integrated circuit 110 continuously. Since there is no gap formed in the outer seal ring 120, the outer seal ring 120 can prevent penetration by contaminants, water, and moisture. For example, water is used for cooling in dicing the integrated circuit 110 from a wafer. If the outer seal ring 120 has a gap, hydrogen and hydroxide ions attack low-k materials in the seal ring gap, resulting in contamination to the integrated circuit 110. For instance, fluorine in fluorinated silicate glass (FSG) will react with water to form hydrogen fluoride, which will erode metal. However, in FIG. 2, the metal layers 122 of the outer seal ring 120 are closed loops, so the outer seal ring 120 can prevent penetration by contaminants, water, and moisture.

Furthermore, after production and electrical testing, a wafer including a plurality of semiconductor devices is divided into rectangular semiconductor device chips, i.e., dies, by a rotary sawing operation. Dies successfully separated by the sawing operation are cleaned and delivered for bonding into a market-recognizable packaging. If the outer seal ring 120 has a gap, microcracking due to stress may be formed when the wafer is sawed into dies. Therefore, in FIGS. 1 and 2, the outer seal ring 120 serves as a die saw crack stopper since the metal layers 122 of the outer seal ring 120 are closed loops. Because of the provision of the outer seal ring 120, circuit regions on the inner side of outer seal ring 120 (i.e., the region of the integrated circuit 110) is protected from influences of external environments, thus it is possible to ensure stability of properties of the semiconductor device over a long period of time.

Figure 3:
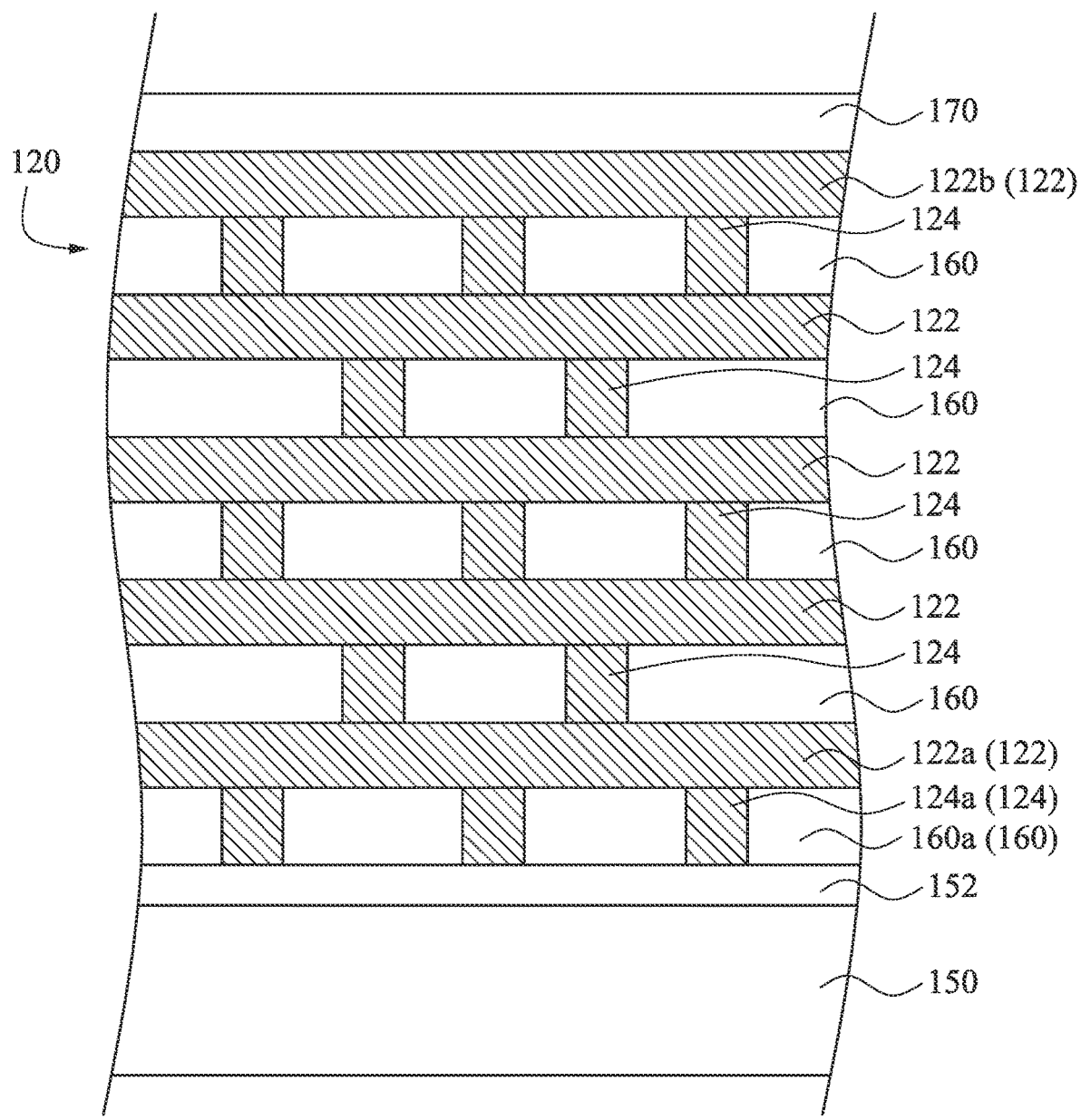
FIG. 3 is a cross-sectional view taking along line 3-3 of FIG. 1.

FIG. 3 is a cross-sectional view taking along line 3-3 of FIG. 1. Reference is made to FIGS. 2 and 3. The semiconductor device may further include a substrate 150 and a plurality of dielectric layers 160 formed on the substrate 150. While not shown in the top view (FIG. 1), the integrated circuit 110 (see FIG. 1) may be formed on the surface of the substrate 150. The outer seal ring 120 is embedded in the dielectric layers 160. In greater detail, the outer seal ring 120 may extend through the dielectric layers 160. As shown in FIG. 3, the outer seal ring 120 may further include an active region 152 and a plurality of contacts 124. The active region 152 is formed in the substrate 150. The metal layers 122 shown in FIG. 3 are plural, and the metal layers 122 may be spaced from each other by one of the dielectric layers 160. In other words, the metal layers 122 and the dielectric layers 160 are alternately stacked. Furthermore, the contacts 124 are also plural and positioned between the metal layers 122. In other words, the contacts 124 are disposed in the dielectric layers 160. For example, the metal layer 122a is separated from the active region 152 by the dielectric layer 160a. The contact 124a is positioned between the metal layer 122a and the active region 152. The metal layers 122 and the contacts 124 are physically connected. In some embodiments, a passivation layer 170 may cover the outermost metal layer 122b.

The metal layers 122 and the contacts 124 may be made of aluminum, copper, tin, nickel, gold, silver, or combinations thereof. The dielectric constant of the dielectric layers 160 may be between about 1 and about 4.2. For example, the dielectric layers 160 may be made of fluorinated silicate glass, carbon doped oxide, fluorinated amorphous carbon, hydrogenated amorphous carbon, hydrogenated silsesquioxane, poly(arylene ethers), cyclotene, silicone oxide aerogel or silicone oxide xerogel. Furthermore, the dielectric layers 160 may be formed by spin coating or chemical vapor deposition.

Reference is made to FIG. 1. The inner seal ring 130 has at least one gap G. The gap G breaks the loop of inner seal ring 130. The broken inner seal ring 130 results in the break of a noise-coupling path, which noise may be formed in an otherwise closed-loop seal ring. The breaking of noise is for isolating the semiconductor device from noises generated by high-frequency circuits, for example, radio-frequency (RF) circuits. In some embodiments, the integrated circuit 110 includes a high-frequency circuit, which may undesirably affect other circuits external to semiconductor device. In some other embodiments, the high-frequency circuit is external to semiconductor device, and thus the integrated circuit 110 needs to be protected from the noise coupling. Since the inner seal ring 130 has the gap G, the noise coupling problems can be solved.

Figure 4:
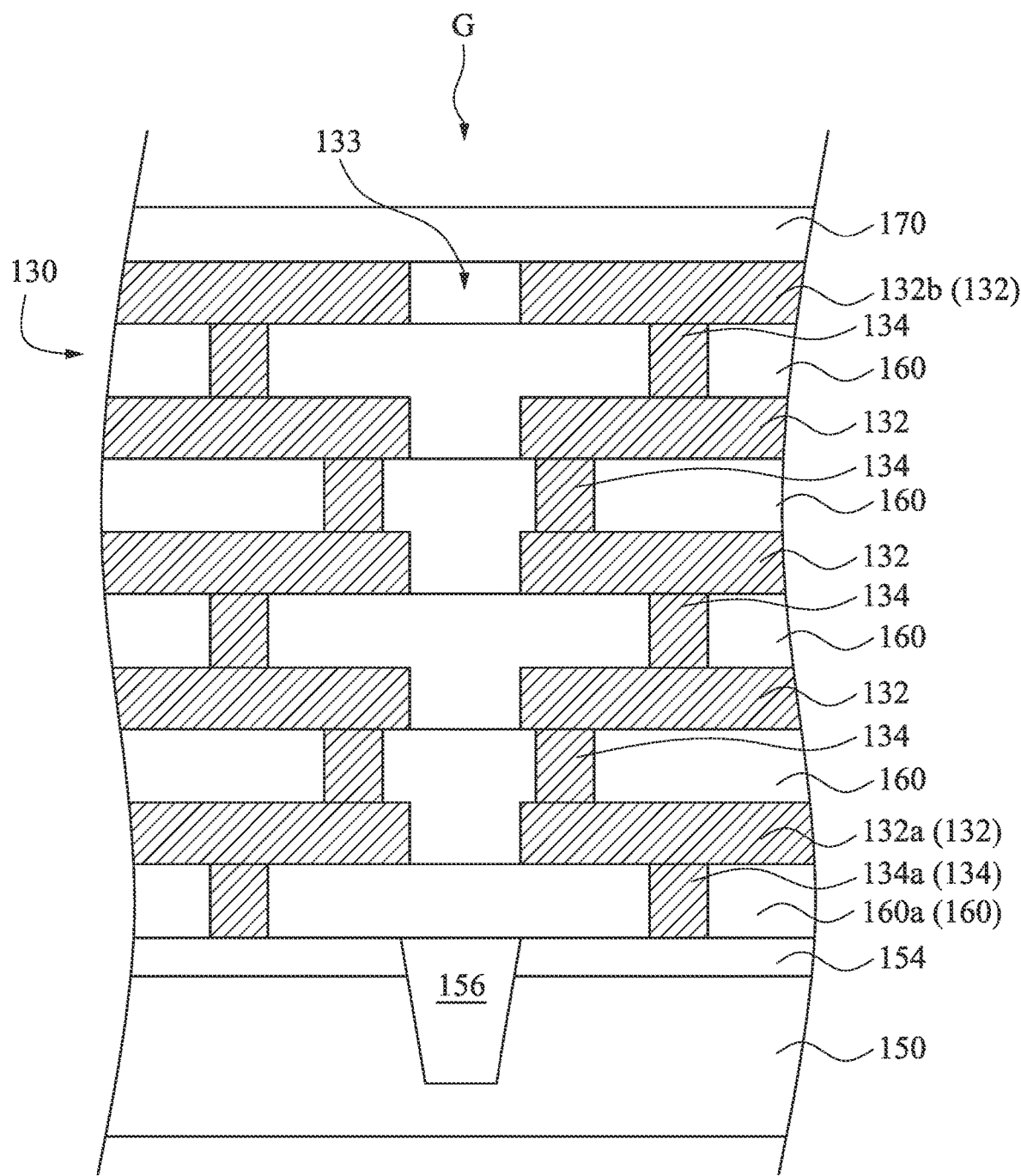
FIG. 4 is a cross-sectional view taking along line 4-4 of FIG. 1.

FIG. 4 is a cross-sectional view taking along line 4-4 of FIG. 1. The inner seal ring 130 is embedded in the dielectric layers 160. In greater detail, the inner seal ring 130 may extend through the dielectric layers 160. As shown in FIG. 4, the inner seal ring 130 is disposed on the substrate 150 and may further include an active region 154, a plurality of metal layers 132, and a plurality of contacts 134. The active region 154 is formed in the substrate 150, and a shallow trench isolation 156 may be located adjacent to the active region 154. The metal layers 132 have gaps 133 filled with one of the dielectric layers 160. The metal layers 132 shown in FIG. 4 may be spaced from each other by one of the dielectric layers 160. In other words, the metal layers 132 and the dielectric layers 160 are alternately stacked. Furthermore, the contacts 134 are also plural and positioned between the metal layers 132. In other words, the contacts 134 are disposed in the dielectric layers 160. For example, the metal layer 132a is separated from the active region 154 by the dielectric layer 160a. The contact 134a is positioned between the metal layer 132a and the active region 154. The metal layers 132 and the contacts 134 are physically connected. In some embodiments, the passivation layer 170 further covers the outermost metal layer 132b. The metal layers 132 and the contacts 134 may be made of aluminum, copper, tin, nickel, gold, silver, or combinations thereof.

In FIG. 4, the metal layers 132 have gaps 133 to form the gap G in FIG. 1. In some embodiments, the gaps 133 are substantially aligned with each other to form the gap G. In other words, the gaps 133 overlap with each other. However, in some other embodiments, the gaps 133 may be misaligned with each other. For example, the gaps 133 are staggered to form the gap G.

Reference is made to FIG. 1. The inner seal ring 130 have a plurality of gaps G, and includes a plurality of seal portions 146 arranging along an inner side of the outer seal ring 120, and two adjacent of the seal portions 146 are separated by one of the gaps G. In other words, the inner seal ring 130 is cut into the seal portions 146 by the gaps G. For example, the inner seal ring 130 in FIG. 1 includes fourteen seal portions 146, and the claimed scope of the present disclosure is not limited in this respect. The seal portions 146 can prevent noise coupling, and also block the electrically interactions between the integrated circuit 110 and the outer seal ring 120.

Figure 5:
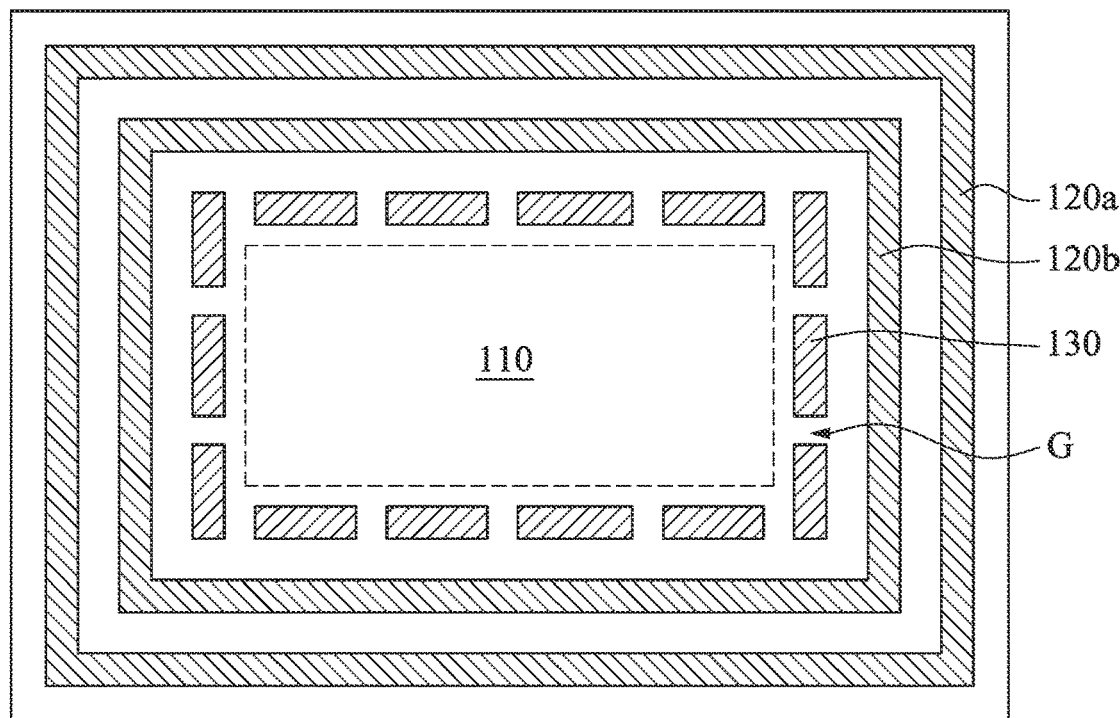
FIG. 5 is a top view of a semiconductor device in accordance with some embodiments of the present disclosure.

FIG. 5 is a top view of a semiconductor device in accordance with some embodiments of the present disclosure. The difference between the semiconductor devices of FIGS. 5 and 1 pertains to the number of the outer seal ring. In FIG. 5, the semiconductor device includes two of the outer seal rings 120a and 120b separated from each other. The outer seal ring 120a surrounds the inner seal ring 130 and the integrated circuit 110, and the outer seal ring 120b is disposed between the outer seal ring 120a and the inner seal ring 130. Both of the outer seal rings 120a and 120b have the closed-loop metal layers 122 (see FIG. 2). Hence, the semiconductor device of FIG. 5 can provide better structural reinforcement than the semiconductor device of FIG. 1 and also can stop undesirable moisture and mobile ionic contaminants from entering the integrated circuit 110 and affecting operational reliability. Other relevant structural details of the semiconductor device in FIG. 5 are similar to the semiconductor device in FIG. 1, and, therefore, a description in this regard will not be repeated hereinafter. It is noted that the numbers of the outer seal rings 120 in FIGS. 1 and 5 are illustrative, and should not limit the claimed scope of the present disclosure. A person having ordinary skill in the art may select a suitable number for the outer seal rings 120 according to actual situations.

Figure 6:
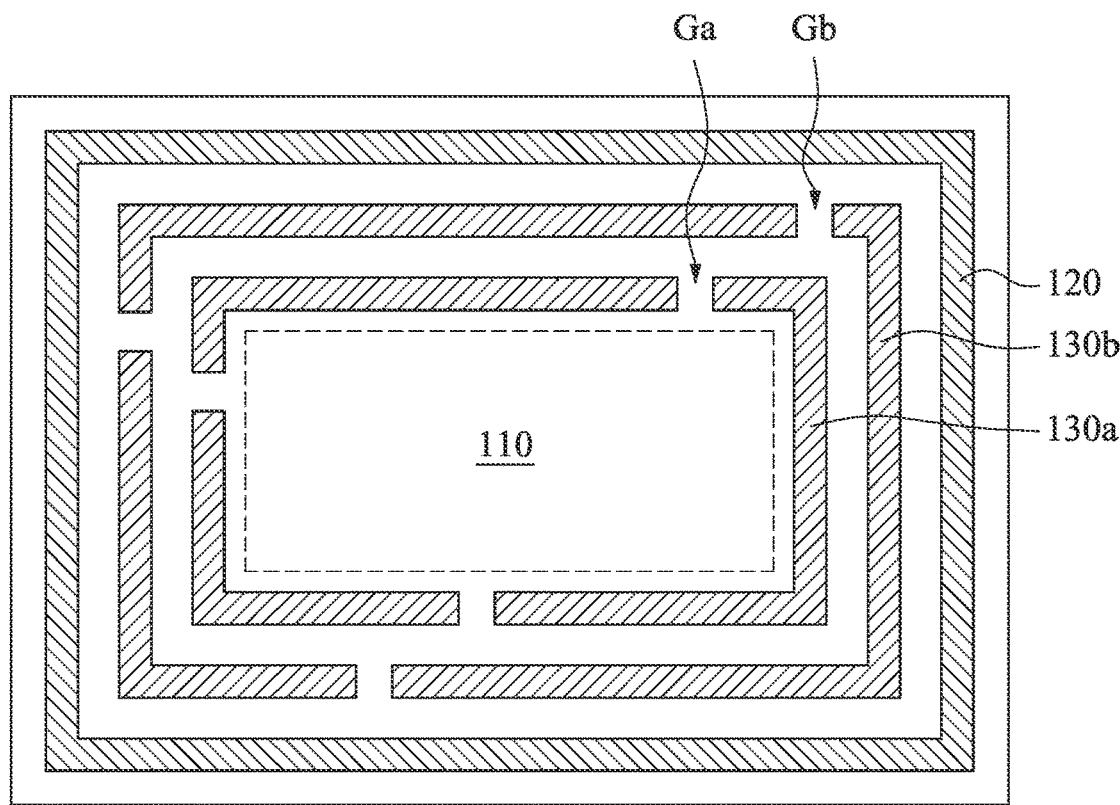
FIG. 6 is a top view of a semiconductor device in accordance with some embodiments of the present disclosure.

FIG. 6 is a top view of a semiconductor device in accordance with some embodiments of the present disclosure. The difference between the semiconductor devices of FIGS. 6 and 1 pertains to the number of the inner seal ring. In FIG. 6, the semiconductor device includes two of the inner seal rings 130a and 130b separated from each other. The inner seal rings 130a is disposed between the outer seal ring 120 and the integrated circuit 110, and the inner seal rings 130b is disposed between the outer seal ring 120 and the inner seal ring 130a. The inner seal ring 130a has at least one gap Ga, and the inner seal ring 130b has at least one gap Gb. The gaps Ga and Gb are not aligned with one another and are, in fact, offset from each other. The offset between the gaps Ga and Gb further reduces the possibility of moisture from the atmosphere penetrating into the integrated circuit 110. When the inner seal ring 130a includes multiple gaps Ga, the inner seal ring 130b can be positioned such that the gaps Gb are offset from the nearest gaps Ga on the inner seal ring 130a. As shown in FIG. 6, while moisture may be able to penetrate through the gap Gb, the moisture does not immediately penetrate into the integrated circuit 110 which could damage components in the integrated circuit 110. The moisture is blocked by the inner seal ring 130a.

The gaps Ga and Gb may be fabricated anywhere along the perimeter of the inner seal rings 130a and 130b. One purpose of the gaps Ga and Gb is to stop noise conduction along the perimeter. Although FIG. 6 illustrates three gaps Ga on the inner seal ring 130a and three gaps Gb on the inner seal ring 130b, additional gaps may be added to each inner seal ring. Moreover, the inner seal rings 130a and 130b may respectively have a single gap. Other relevant structural details of the semiconductor device in FIG. 6 are similar to the semiconductor device in FIG. 1, and, therefore, a description in this regard will not be repeated hereinafter. It is noted that the numbers of the inner seal rings 130 in FIGS. 1 and 6 are illustrative, and should not limit the claimed scope of the present disclosure. A person having ordinary skill in the art may select a suitable number for the inner seal rings 130 according to actual situations.

Figure 7A:
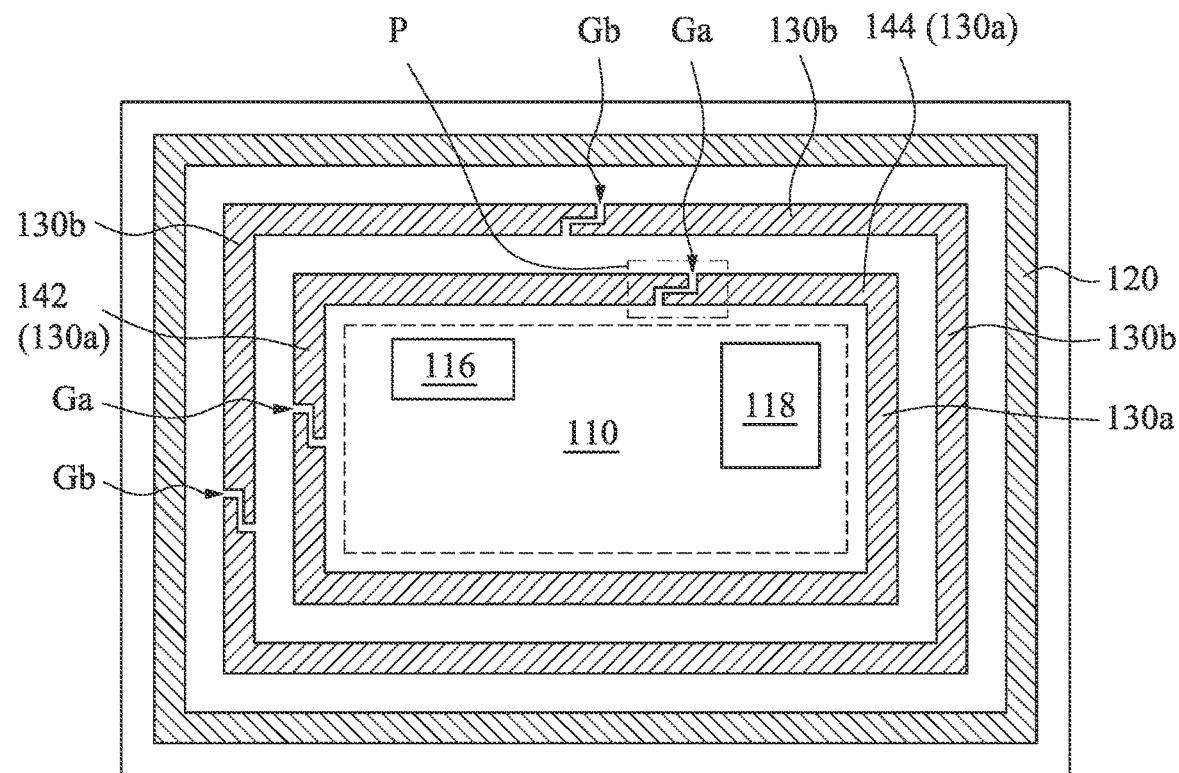
FIG. 7A is a top view of a semiconductor device in accordance with some embodiments of the present disclosure.
Figure 7B:
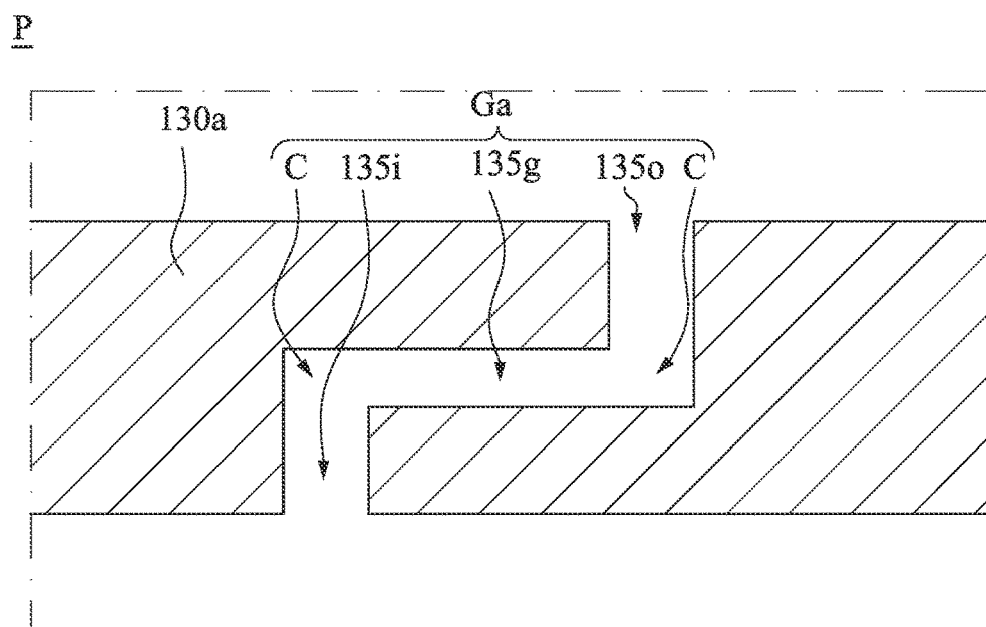
FIG. 7B is an enlarged illustrative diagram of area P of FIG. 7A.

FIG. 7A is a top view of a semiconductor device in accordance with some embodiments of the present disclosure, and FIG. 7B is an enlarged illustrative diagram of area P of FIG. 7A. The difference between the semiconductor devices of FIGS. 7A, 7B and 6 pertains to the configuration of the inner seal ring 130a and 130b. In FIG. 7A, the inner seal ring 130a has two gaps Ga, and the inner seal ring 130b has two gaps Gb. The gaps Ga are misaligned with the gaps Gb. Furthermore, at least one of the gaps Ga and Gb forms a Z shape. Taking one of the gaps Ga as an example, the gap Ga has an inner opening 135i facing the integrated circuit 110, an outer opening 135o facing the outer seal ring 120 and the inner seal ring 130b, and a groove 135g connecting the inner opening 135i and the outer opening 135o, and the groove 135g has two corners C. In FIG. 7B, the outer opening 135o and the inner opening 135i are not aligned. That is, the outer opening 135o and the inner opening 135i are located apart along the extending direction of the inner seal ring 130a. With this configuration, the penetration path of water, moisture, or cracks can be elongated.

In FIG. 7A, the gaps Ga and Gb can have similar shapes, i.e., the gaps Ga and Gb are Z-shaped to elongate the penetration path of water, moisture, or cracks. Moreover, the integrated circuit 110 has at least one first circuit 116 and at least one second circuit 118 separated from the first circuit 116. The gaps Ga cut the inner seal ring 130a into a first portion 142 near the first circuit 116 and a second portion 144 near the second circuit 118. In some embodiments, the first circuit 116 can be an analog circuit, and the second circuit 118 can be a digital circuit. Other relevant structural details of the semiconductor device in FIGS. 7A and 7B are similar to the semiconductor device in FIG. 6, and, therefore, a description in this regard will not be repeated hereinafter.

Figure 7C:
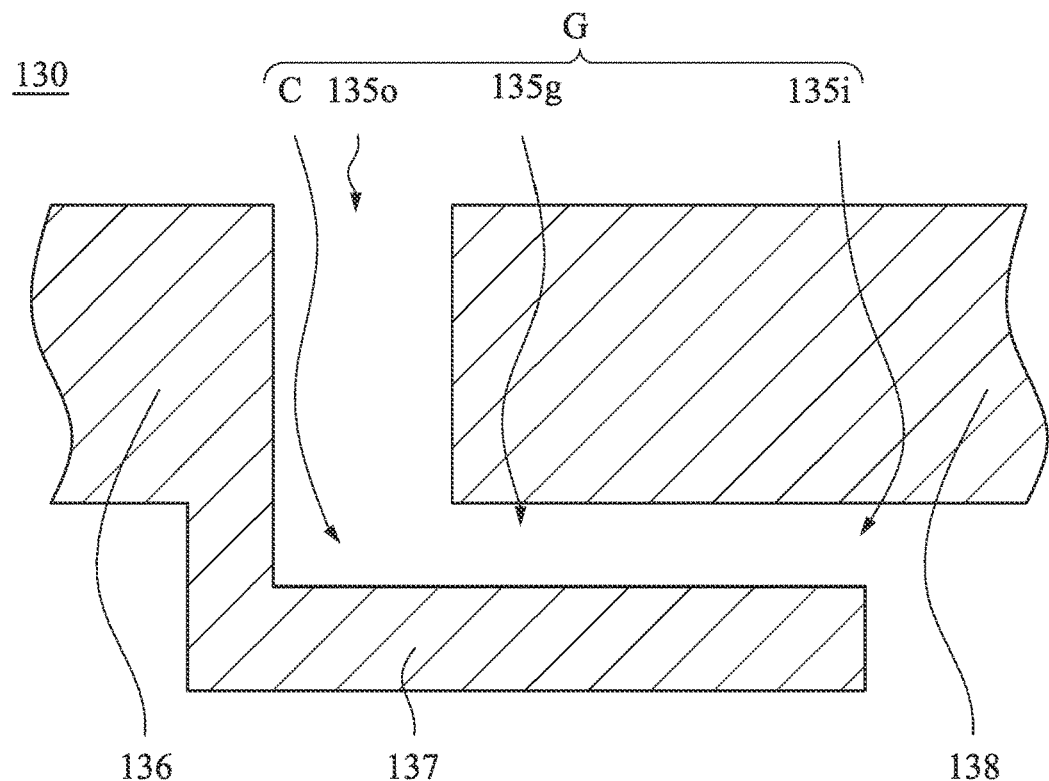
FIGS. 7C and 7D are enlarged top views of semiconductor devices in accordance with some embodiments of the present disclosure.
Figure 7D:
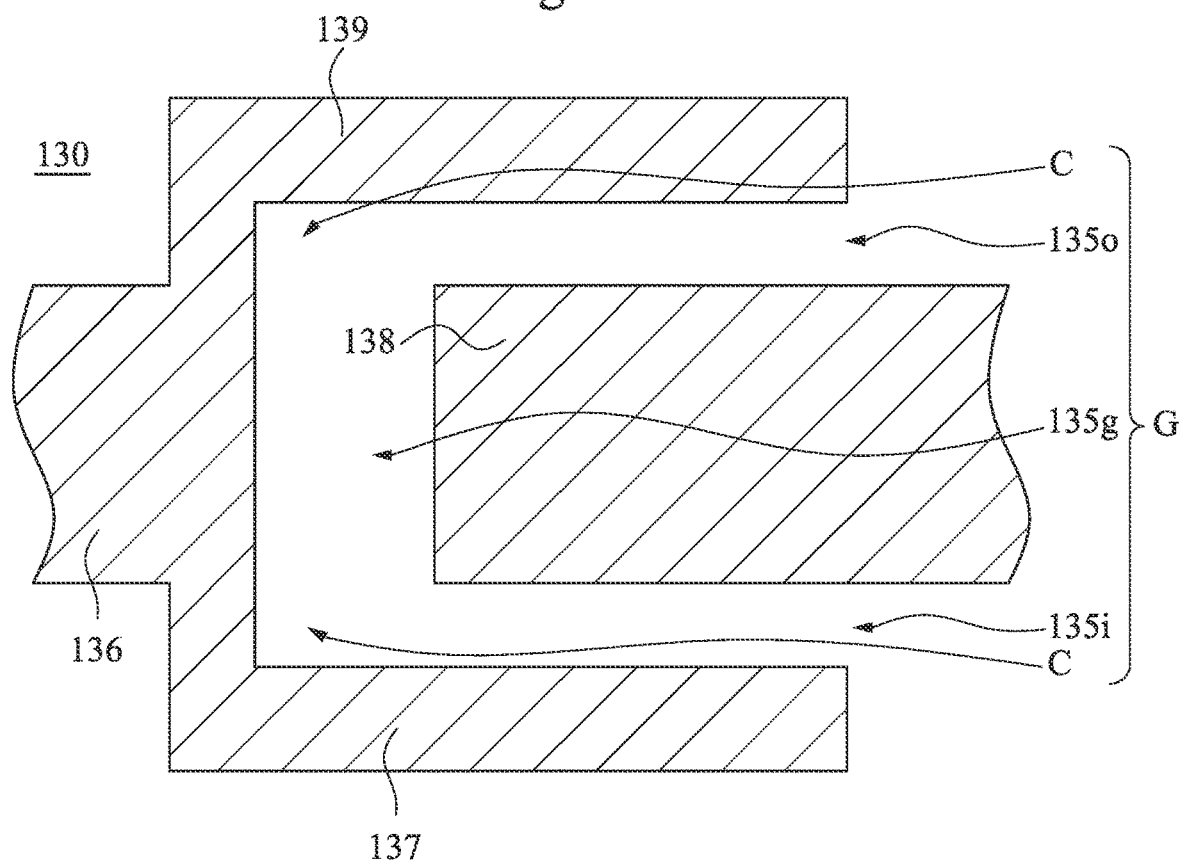

FIGS. 7C and 7D are enlarged top views of semiconductor devices in accordance with some embodiments of the present disclosure. The difference between the semiconductor devices of FIGS. 7C, 7D and 7B pertains to the shape of the gap G of the inner seal ring 130. In FIG. 7C, the gap G forms an L shape. In other words, the inner seal ring 130 has a first end 136 and a second end 138 both facing the gap G, i.e., the gap G is disposed between the first end 136 and the second end 138. The inner seal ring 130 further has a barrier 137 connected to the first end 136, extending to a side of the second end 138, and separated from the second end 138. The barrier 137 includes the same metal as, and is formed simultaneously with the formation of, the first end 136 of the inner seal ring 130. Therefore, the groove 135g connected to the outer opening 135o and the inner opening 135i of the gap G has a corner C. With this configuration, the moisture-traveling path is further extended. In FIG. 7D, the gap G forms a C shape. In other words, the inner seal ring 130 further has a barrier 139 connected to the first end 136, opposite to the barrier 137, extending to another side of the second end 138, and separated from the second end 138. The barrier 139 includes the same metal as, and is formed simultaneously with the formation of, the first end 136 of the inner seal ring 130. Therefore, the groove 135g connected to the outer opening 135o and the inner opening 135i of the gap G has two corners C. With this configuration, the moisture-traveling path is further extended. Other relevant structural details of the semiconductor device in FIGS. 7C and 7D are similar to the semiconductor device in FIG. 7B, and, therefore, a description in this regard will not be repeated hereinafter.

Figure 8:
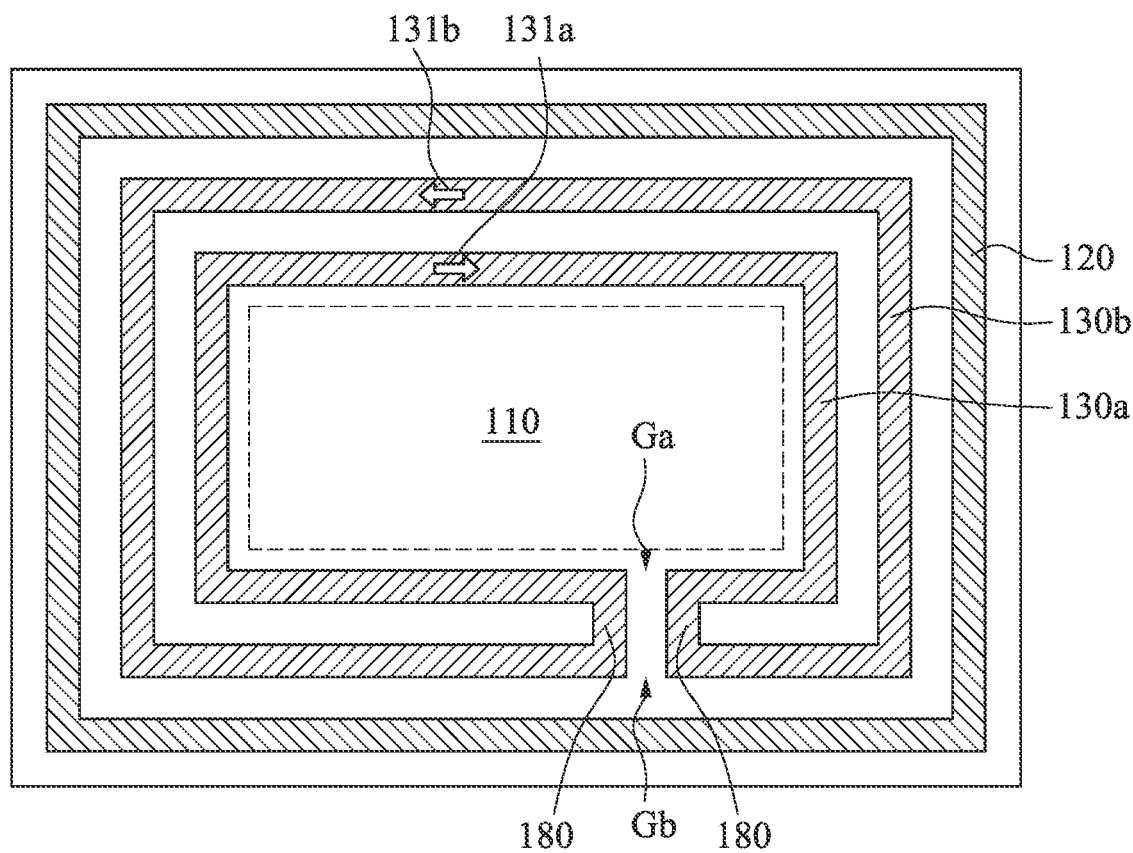
FIG. 8 is a top view of a semiconductor device in accordance with some embodiments of the present disclosure.

FIG. 8 is a top view of a semiconductor device in accordance with some embodiments of the present disclosure. The difference between the semiconductor devices of FIGS. 8 and 1 pertains to the configuration of the inner seal rings. In FIG. 8, the gaps Ga and Gb of the inner seal rings 130a and 130b are substantially aligned with each other, and the semiconductor device further includes two connectors 180 connecting the two inner seal rings 130a and 130b, such that the two inner seal rings 130a and 130b and the two connectors 180 together form a closed loop. In greater detail, the gaps Ga and Gb are aligned and connect with the inner seal rings 130a and 130b at a substantially 90° angle in some embodiments. In other words, at least one of the two connectors 180 extends perpendicular to at least one of the inner seal rings 130a and 130b. In some other embodiments, the connectors 180 are curved lines such as arcs or any other shapes. In still some other embodiments, the gaps Ga and Gb are not aligned, and the two connectors 180 may have different shapes or angles other than straight lines connecting with the inner seal rings 130a and 130b at a substantially 90° angle. In some embodiments, the connectors 180 includes the same or similar metal and structure as, and is formed simultaneously with the formation of, the inner seal rings 130a and 130b.

With this configuration, the inner seal rings 130a and 130b induces a reverse current for any current resulting from noise to reduce mutual inductance. For example, if a first current 131a is induced on the inner seal ring 130a from radio frequency noise or another source of noise, a second current 131b in the opposite direction (reverse current) is induced in the inner seal ring 130b. The reverse current is induced because the inner seal rings 130a and 130b form a closed loop with the two connectors 180. The mutual inductance from the opposite currents 131a and 131b is reduced or eliminated because of the opposite direction of induced magnetic fields from the currents 131a and 131b. Therefore, the influence of radio frequency noise or another noise source is reduced or eliminated on the semiconductor device. Other relevant structural details of the semiconductor device in FIG. 8 are similar to the semiconductor device in FIG. 1, and, therefore, a description in this regard will not be repeated hereinafter.

Figure 9:
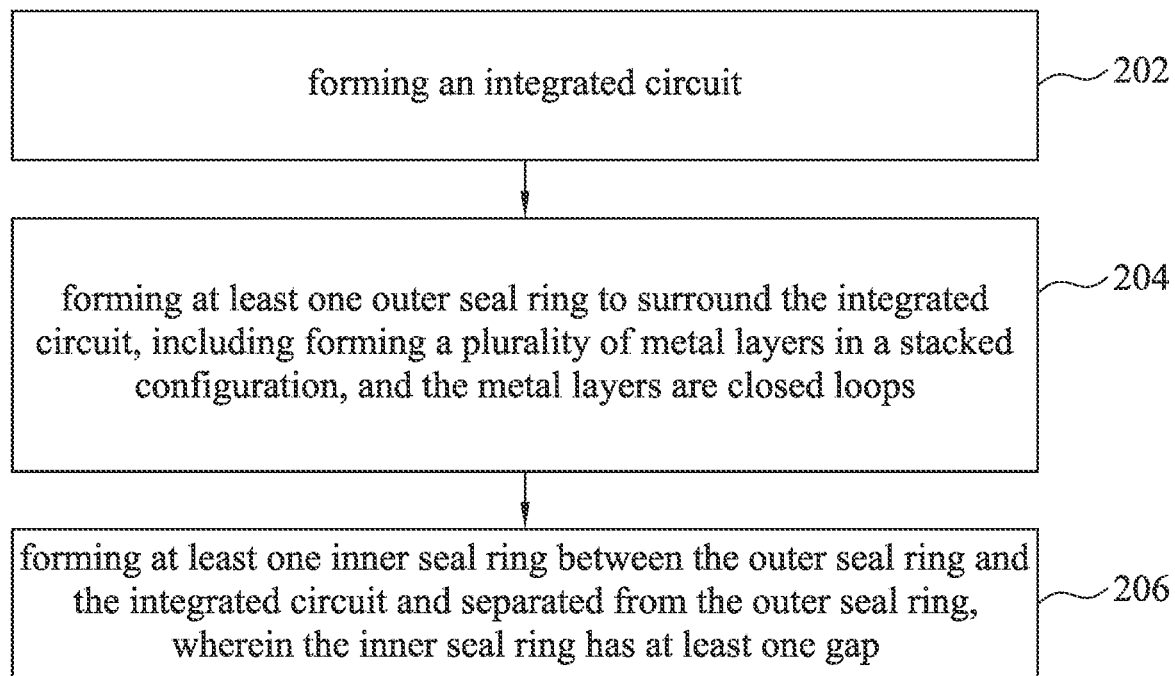
FIG. 9 is a flowchart for a method of forming a semiconductor device in accordance with some embodiments of the present disclosure.

FIG. 9 is a flowchart for a method of forming a semiconductor device in accordance with some embodiments of the present disclosure. At operation 202, an integrated circuit is formed. At operation 204, at least one outer seal ring is formed to surround the integrated circuit. The operation 204 includes forming a plurality of metal layers in a stacked configuration, and the metal layers are closed loops. At operation 206, at least one inner seal ring is formed between the outer seal ring and the integrated circuit and separated from the outer seal ring. The inner seal ring has at least one gap extending from a region encircled by the inner seal ring to a region outside the inner seal ring. Even though the flowchart is shown with multiple operations in an order, the operations can be implemented with different orders or simultaneously with each other. For example, a metal layer can be deposited for the outer seal ring and the inner seal ring simultaneously. For another example, the outer seal ring and the inner seal ring are formed simultaneously with the integrated circuit.

In various embodiments, the outer seal ring and the inner seal ring include electrically conductive material or metal such as aluminum, copper, tin, nickel, gold, silver, or combinations thereof. In some embodiments, the outer seal ring and the inner seal ring include multiple layers, e.g., metal layers and contacts. The metal layers and the contacts can include any suitable material and be formed or fabricated using any suitable methods or processes known in the art. For example, the metal layers include aluminum, copper, tin, nickel, gold, silver, or combinations thereof, and can be deposited using electroplating, physical vapor deposition (PVD), sputtering, or any other suitable process and defined by etching. The contacts include Cu, Cu alloy, W, Au, Al, or any other suitable material in some embodiments. The contacts can be formed by PVD, chemical vapor deposition (CVD), and chemical-mechanical planarization (CMP), for example.

According to the aforementioned embodiments, since the semiconductor device includes the closed-loop outer seal ring and the gapped inner seal ring, the outer seal ring and inner seal ring together can provide structural reinforcement and stop undesirable moisture and mobile ionic contaminants from entering the integrated circuit and affecting operational reliability, also break the noise-coupling path.

According to some embodiments, a semiconductor device includes an integrated circuit, at least one outer seal ring, and at least one inner seal ring. The outer seal ring surrounds the integrated circuit. The outer seal ring includes a plurality of metal layers in a stacked configuration, and the metal layers are closed loops. The inner seal ring is disposed between the outer seal ring and the integrated circuit and separated from the outer seal ring. The inner seal ring has at least one gap extending from a region encircled by the inner seal ring to a region outside the inner seal ring.

According to some embodiments, a semiconductor device includes an integrated circuit, at least one outer seal ring, and at least one inner seal ring. The outer seal ring is disposed around the integrated circuit. The outer seal ring includes a plurality of metal layers in a stacked configuration, and the metal layers surround the integrated circuit continuously. The inner seal ring is disposed between the outer seal ring and the integrated circuit and separated from the outer seal ring. The inner seal ring surrounds the integrated circuit discontinuously.

According to some embodiments, a method for manufacturing a semiconductor device includes forming an integrated circuit. At least one outer seal ring is formed to surround the integrated circuit, including forming a plurality of metal layers in a stacked configuration. The metal layers are closed loops. At least one inner seal ring is formed between the outer seal ring and the integrated circuit and separated from the outer seal ring. The inner seal ring has at least one gap extending from a region encircled by the inner seal ring to a region outside the inner seal ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
   an integrated circuit located within a rectangular area defined by four sequentially connected first, second, third, and fourth linear edges, wherein the first and third linear edges are parallel, and the second and fourth linear edges are parallel;

a first seal ring surrounding the integrated circuit, wherein the first seal ring comprises a plurality of first seal portions separated from each other by a plurality of first gaps, and one of the first seal portions has a first width measured in a direction perpendicular to a lengthwise direction of the one of the first seal portions;

a second seal ring surrounding the integrated circuit and between the integrated circuit and the first seal ring, wherein the second seal ring comprises a plurality of second seal portions separated from each other by a plurality of second gaps, and a first one of the second seal portions has a second width measured in a direction perpendicular to a lengthwise direction of the first one of the second seal portions, the second width of the one of the second seal portions of the second seal ring is substantially the same as the first width of the one of the first seal portions of the first seal ring, the first one of the second seal portions has a first L-shaped top view profile comprising a first linear portion that runs along the first linear edge and a second linear portion that runs along the second linear edge, a second one of the second seal portions has a second L-shaped top view profile comprising a third linear portion that runs along the first linear edge and a fourth linear portion that runs along the fourth linear edge, and from a top view, the first and second ones of the second seal portions are free of other second seal portions therebetween, wherein from a cross-sectional view, the first one of the second seal portions of the second seal ring further comprises a plurality of metal layers and a plurality of vias alternately arranged in a vertical direction over a substrate, and wherein a first one of the vias, positioned within a first height layer, is the via located closest to longitudinal ends of the first and second ones of the metal layers and being sandwiched between the first and second ones of the metal layers, wherein a second one of the vias, positioned within a second height layer, is the via located closest to the longitudinal end of the first one of the metal layers and being disposed on a bottom surface of the first one of the metal layers opposing the first one of the vias, and wherein a footprint of the first one of the vias does not overlap with a footprint of the second one of the vias on the substrate; and a dielectric layer surrounding the first seal ring and the second seal ring, wherein the dielectric layer comprises a plurality of first filling portions in the first gaps, respectively, and a plurality of second filling portions in the second gaps, respectively, wherein a connection line of one of the plurality of first filling portions and one of the plurality of second filling portions closest to said one of the plurality of first filling portions is not parallel to the first, second, third, and fourth linear edges of the integrated circuit.

2. The device of claim 1, wherein said one of the first seal portions is L-shaped in a top view.

3. The device of claim 1, further comprising a third seal ring surrounding the first seal ring and the second seal ring, wherein the third seal ring forms a closed loop.

4. The device of claim 1, further comprising:
a first active region, a second active region, and a shallow trench isolation separating the first active region from the second active region, wherein in the cross-sectional view, the first one of the second seal portions of the second seal ring is above the first active region, the second one of the second seal portions of the second seal ring is above the second active region, and a corresponding one of the second gaps between the first and second ones of the second seal portions of the second seal ring is located directly above the shallow trench isolation.

5. The device of claim 1, wherein a third one of the vias of the second seal ring, positioned within a third height layer, is the via located closest to the longitudinal end of the second one of the metal layers of the second seal ring and being disposed on a top surface of the second one of the metal layers opposing the first one of the vias of the second seal ring, and the footprint of the first one of the vias of the second seal ring does not overlap with a footprint of the third one of the vias of the second seal ring on the substrate.

6. The device of claim 5, wherein the footprint of the third one of the vias of the second seal ring overlaps with the footprint of the second one of the vias of the second seal ring on the substrate.

7. The device of claim 1, wherein the first height layer of the first one of the vias of the second seal ring is different than the second height layer of the second one of the vias of the second seal ring.

8. A device comprising:
an integrated circuit having a corner and located within a rectangular area defined by four sequentially connected first, second, third, and fourth linear edges, wherein the first and third linear edges are parallel, and the second and fourth linear edges are parallel;

a first seal ring surrounding the integrated circuit, wherein the first seal ring comprises:
a first seal portion at the corner of the integrated circuit, wherein the first seal portion has a first L-shaped top view profile comprising a first linear part that runs along the first linear edge and a second linear part that runs along the second linear edge, wherein from a cross-sectional view, the first seal portion of the first seal ring comprises: a plurality of metal layers and a plurality of vias alternately arranged in a vertical direction, wherein a sidewall of a first one of the vias, positioned on a top surface of a first one of the metal layers, horizontally recessed relative to a sidewall of a longitudinal end of the first one of the metal layers by a first distance, wherein the first one of the vias is the via closest to the longitudinal end of the first one of the metal layers, wherein a sidewall of a second one of the vias, positioned on a bottom surface of the first one of the metal layers, horizontally recessed relative to the sidewall of the longitudinal end of the first one of the metal layers by a second distance, wherein the second one of the vias is the via closest to the longitudinal end of the first one of the metal layers of the first seal ring, and the second distance is distinct than the first distance; and a second seal portion spaced apart from the first seal portion of the first seal ring by a first gap, wherein the second seal portion has a second L-shaped top view profile comprising a third linear part that runs along the first linear edge and a fourth linear part that runs along the fourth linear edge, and from a top view, the first and second seal portions are free of other seal portions therebetween; and a second seal ring surrounding the integrated circuit and first seal ring, wherein the second seal ring comprises:
a third seal portion at the corner of the integrated circuit, wherein the third seal portion has a fifth linear part that runs along the first linear edge in the top view and a sixth linear part that is connected to the fifth linear part and runs along the second linear edge in the top view; and a fourth seal portion spaced apart from the third seal portion of the second seal ring by a second gap.

9. The device of claim 8, wherein the sixth linear part of the third seal portion of the second seal ring is longer than the second linear part of the first seal portion of the first seal ring.

10. The device of claim 8, wherein the third linear part of the second seal portion of the first seal ring is longer than the first linear part of the first seal portion of the first seal ring.

11. The device of claim 8, wherein the third linear part of the second seal portion of the first seal ring is longer than the fifth linear part of the third seal portion of the second seal ring.

12. The device of claim 8, wherein the fourth seal portion of the second seal ring comprises a seventh linear part that runs along the first linear edge.

13. The device of claim 12, wherein the seventh linear part of the fourth seal portion of the second seal ring is longer than the fifth linear part of the third seal portion of the second seal ring.

14. The device of claim 8, wherein the first distance is greater than the second distance.

15. The device of claim 8, wherein the first one of the vias of the first seal ring is sandwiched between the first one of the metal layers of the first seal ring and a second one of the metal layers of the first seal ring, a sidewall of a third one of the vias of the first seal ring is positioned on a top surface of the second one of the metal layers of the first seal ring and horizontally recessed relative to a sidewall of a longitudinal end of the second one of the metal layers of the first seal ring by a third distance, and the third one of the vias of the first seal ring is the via closest to the longitudinal end of the second one of the metal layers of the first seal ring, and the third distance is distinct than the first distance.

16. The device of claim 8, wherein the first distance is greater than the second and third distances.

17. A device comprising:

an integrated circuit located within a rectangular area defined by four sequentially connected first, second, third, and fourth linear edges, wherein the first and third linear edges are parallel, and the second and fourth linear edges are parallel;

a first seal ring surrounding the integrated circuit;

a second seal ring between the first seal ring and the integrated circuit, wherein the second seal ring comprises:

a first seal portion having a first L-shaped top view profile comprising a first linear part that runs along the first linear edge and a second linear part that runs along the second linear edge; and a second seal portion having a second L-shaped top view profile comprising a third linear part that runs along the first linear edge and a fourth linear part that runs along the fourth linear edge, wherein from a top view, the first seal portion and the second seal portion are free of other seal portions therebetween; and a third seal ring surrounding the first seal ring, the second seal ring, and the integrated circuit, wherein, from a cross-sectional view, the third seal ring includes a plurality of metal layers and a plurality of vias alternately arranged in a vertical direction, and an entirety of first ones of the vias at a first horizontal level does not overlap with an entirety of second ones of the vias at a second horizontal level.

18. The device of claim 17, wherein the third seal ring forms a closed loop.

19. The device of claim 17, wherein a distance between the third seal ring and the first seal ring is substantially equal to a distance between the first seal ring and the second seal ring.

20. The device of claim 17, wherein an entirety of third ones of the vias at a third horizontal level does not overlap with the entirety of the second ones of the vias at the second horizontal level.

* * * * *